US007218110B2

(12) United States Patent
Zhang et al.

(10) Patent No.: US 7,218,110 B2
(45) Date of Patent: May 15, 2007

(54) METHOD AND APPARATUS FOR DIFFUSION MAGNETIC RESONANCE IMAGING WITH THE EFFECTS OF EDDY CURRENTS COMPENSATED

(75) Inventors: Weiguo Zhang, Foster City, CA (US); David M. Kramer, Corte Madera, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 0 days.

(21) Appl. No.: 11/217,405

(22) Filed: Sep. 2, 2005

(65) Prior Publication Data

US 2007/0052417 A1   Mar. 8, 2007

(51) Int. Cl.
*G01V 3/00* (2006.01)
(52) U.S. Cl. ...................... 324/309; 324/307
(58) Field of Classification Search ............. 324/309
See application file for complete search history.

(56) References Cited

U.S. PATENT DOCUMENTS

| | | | | |
|---|---|---|---|---|
| 5,864,233 | A * | 1/1999 | Zhou et al. | 324/309 |
| 6,144,202 | A | 11/2000 | Kanazawa et al. | |
| 6,239,599 | B1 * | 5/2001 | Zhou et al. | 324/309 |
| 6,323,646 | B1 * | 11/2001 | Zhou et al. | 324/309 |
| 6,489,766 | B1 * | 12/2002 | Alsop | 324/313 |
| 2004/0071324 | A1 * | 4/2004 | Norris et al. | 382/128 |
| 2004/0227510 | A1 * | 11/2004 | Rose et al. | 324/309 |
| 2005/0001616 | A1 * | 1/2005 | Jenniskens et al. | 324/307 |

OTHER PUBLICATIONS

Nils Bodammer et al, "Eddy Current Correction In Diffusion-Weighted Imaging Using Pairs of Images Acquired With Opposite Diffusion Gradient Polarity", Magnetic Resonance in Medicine, 51:188-193 (2004).
G.K. Rohde et al., "Comprehensive Approach For Correction of Motion and Distortion in Diffusion-Weighted MRI", Magnetic Resonance in Medicine 51:103-114 (2004).
Huairen Zeng et al., "Image Distortion Correction in EPI: Comparison on Field Mapping With Point Spread Function Mapping", Magnetic Resonance in Medicine 48:137-146 (2002).
Peter Jezzard et al, "Characterization of and Correction for Eddy Current Artifacts in Echo Planar Diffusion Imaging", MRM 39:801-812, (1998).
Mark A. Horsfield, "Mapping Eddy Current Induced Fields For the Correction of Diffusion-Weighted Echo Planar Images", Magnetic Resonance Imaging, vol. 17, No. 9, pp. 1335-1345, 1999.

(Continued)

*Primary Examiner*—Brij Shrivastav
*Assistant Examiner*—Megann E Vaughn
(74) *Attorney, Agent, or Firm*—Nixon & Vanderhye P.C.

(57) ABSTRACT

A method and a system for acquiring diffusion magnetic resonance images with compensation of the effects of eddy currents induced by the diffusion weighting (DW) gradient pulses. Prescan data are first acquired using the same DW sequence to be used for imaging. The prescan data are used to obtain eddy current parameters that model the effects of DW-induced eddy currents under the exact conditions under which DW images are to be acquired. The DW imaging sequence is then slightly modified according to the eddy current parameters and used to acquire DW image data with the effects of DW-induced eddy currents compensated.

25 Claims, 3 Drawing Sheets

OTHER PUBLICATIONS

T.G. Reese et al., "Reduction of Eddy-Current-Induced Distortion in Diffusion MRI Using a Twice-Refocused Spin Echo", Magnetic Resonance in Medicine 49:177-182 (2003).

E. O. Stejskal et al, "Spin Diffusion Measurements: Spin Echoes in the Presence of a Time-Dependent Field Gradient", The Journal of Chemical Physics, vol. 42, No. 1, Jan. 1, 1965, pp. 288-292.

J.E. Tanner, "Use of the Simulated Echo in NMR Diffusion Studies", The Journal of Chemical Physics, vol. 52, No. 5, pp. 2523-2526. Mar. 1, 1970.

Josien P. W. Pluim et al, "Mutual-Information-Based Registration of Medical Images: A Survey", IEEE Transactions of Medical Imaging, vol. 22, No. 8, pp. 986-1004, Aug. 2003.

* cited by examiner

METHOD AND APPARATUS FOR DIFFUSION MAGNETIC RESONANCE IMAGING WITH THE EFFECTS OF EDDY CURRENTS COMPENSATED

BACKGROUND OF THE INVENTION

This invention relates to producing diffusion magnetic resonance (DMR) images and, in particular, to compensating for effects of eddy currents.

Magnetic resonance imaging (MRI) applies a strong static magnetic field, a radio frequency (RF) magnetic field and time varying magnetic field gradients to an object to be imaged. These fields cause precession of the nuclear spins in the molecules of the object. The nuclear spins, e.g., hydrogen nuclei in water molecules, behave in a predictable manner in response to the magnetic fields applied by the static, RF and gradient fields. For example, the gradient fields (produced by three orthogonal coils around the object) spatially encode the nuclear spins. The precessing nuclear spins emit RF signals that are detected and analyzed by the MRI system to reconstruct an image of the object.

Many techniques have been developed to acquire magnetic resonance (MR) images. These techniques apply various magnetic gradient pulses and RF pulses to manipulate nuclear spins to achieve desired imaging time, image contrast, resolutions and other image characteristics. Two closely related techniques that have been increasingly used are diffusion weighted imaging (DWI) and diffusion tensor imaging (DTI). In what follows, we will refer to them as simply diffusion MRI (DMRI).

In DMRI, pulse sequences are applied to provide contrast between molecules having different degrees of random movement. Diffusion-weighting gradients enhance the signal differences due to variations in diffusivity of the molecules in the object being imaged. The signal differences are used to generate images with diffusion contrast. In proton MRI, DMRI images depict differences in water molecular diffusion.

A problem associated with DMRI is the effect of eddy currents induced by the strong diffusion-weighting gradient pulses. DMRI relies on measurements in which the direction and/or strength of diffusion-weighting gradient pulses are varied. DMRI sequences tend to apply gradient lobes having high amplitudes that create eddy currents in the MRI hardware. These eddy currents are disadvantageous in that they adversely influence the acquired MR imaging data, and consequently cause image distortions that depend on the strength and orientation of the diffusion-weighting gradient pulses.

Prior methods to address the effects of eddy currents induced by strong diffusion-weighting gradient pulses can generally be categorized as (1) post acquisition corrections and (2) DMRI sequence modification. In the first category, some form of image correction is applied post image data acquisition to correct for eddy current artifacts in the acquired image data. Geometrical corrections are performed by image registration or by pre-mapping the eddy currents. Though post acquisition correction by image registration does not require a detailed knowledge about the eddy currents, the robustness and quality of such correction procedures are often limited by the particular algorithm used. Further, post-acquisition correction is often compromised by image distortions caused by effects other than eddy currents. In addition, eddy currents often produce signal losses that cannot be easily corrected by post acquisition procedures.

In the second category, a DMRI sequence is modified to reduce eddy currents produced by the diffusion-weighting gradient pulses or to diminish the effects of eddy currents on the images. Modifying DMRI sequences to counter the effects of the eddy currents has been problematic. For example, double-spin echoes have been applied to reduce eddy currents. However, reduction of eddy currents by generating double spin-echoes has the undesired side effect of prolonging the DMRI sequences and requires more gradient switching. In addition, calibration techniques have been applied in attempts to fully characterize eddy currents produced by the diffusion-weighting gradient pulses. Using calibration information for a MRI system, the effects of eddy currents within a DMRI sequence are predicted and the DMRI sequence is modified to null or reduce the effects of the eddy currents, such as by introducing gradient offsets. However, characterization of eddy currents based on calibration information does not fully predict the eddy currents induced within the DMRI sequences that will actually be used for imaging. Further, the eddy current characterization is most accurate at the time when the calibration procedure is performed and becomes less and less accurate as the characteristics of the MRI system change in time. Moreover, eddy currents induced by the diffusion-weighting gradient pulses depend on the orientation and strength of the gradients, as well as on the timing of the DMRI sequence and on how the sequence events are interleaved. Accordingly, it is difficult to fully characterize the eddy currents ahead of time that reflect what truly occur post-calibration during any DMRI sequence.

In view of the difficulties with prior eddy current compensation techniques (especially those that modify the DMRI sequence), there remains a long-felt need for pre-scan techniques that can easily and quickly measure and compensate for the effects of the eddy currents induced by diffusion-weighting gradient pulses within a DMRI sequence.

BRIEF DESCRIPTION OF THE INVENTION

A technique has been developed to correct for the effects of eddy currents by modifying a DMRI sequence and, in particular, to correct for the effects of eddy currents induced by the diffusion-weighting gradient pulses. The technique acquires pre-scan data that is used to determine the parameters of the eddy current effects that result from the diffusion-weighting segment of a DMRI sequence. These parameters are applied to adjust the DMRI sequence during actual imaging of an object.

An advantage of the present technique is that the diffusion-weighting segment used to determine the eddy current parameters is the same as the diffusion-weighting segment used in the DMRI sequence. Accordingly, the eddy current parameters model to a high degree of accuracy the eddy currents that would have otherwise arisen from the DMRI sequence. By modifying the DMRI sequence using the eddy current parameters, the effects of the eddy currents can be minimized.

To determine the eddy current parameters, pre-scan data is acquired by using the exact same diffusion weighting and timing of the DMRI sequence that is to be used later in imaging. Instead of acquiring the imaging data, the pre-scan data are acquired with simple projections along the same directions of the diffusion-weighting gradient pulses. The projections from the pre-scan are processed to extract the eddy current parameters that are then used to modify the diffusion imaging sequence during actual imaging of the same object.

A method has been developed for diffusion magnetic resonance imaging (DMRI) with compensation of eddy currents, comprising: acquiring pre-scan data using a first sequence including a diffusion weighting segment and a projection acquisition segment; applying the projection data to determine eddy current parameters that characterize the effects of eddy currents induced by the diffusion-weighting segment; adjusting a second diffusion imaging sequence that has the same diffusion-weighting segment as that of the first sequence and an imaging acquisition segment, based on the eddy current parameters; acquiring image data of an object using the adjusted second diffusion imaging sequence, and generating an image of an object using the acquired image data.

The eddy current parameters may comprise a gradient moment ($\Delta M_E$), a gradient offset ($\Delta G_E$) and a frequency shift ($\Delta f_E$), wherein the gradient moment ($\Delta M_E$) is the integral, up to the imaging acquisition window, of gradient field induced by the eddy currents, the gradient offset ($\Delta G_E$) is the time-independent error contribution in the gradient field induced by the eddy currents inside the imaging acquisition window, and the frequency shift ($\Delta f_E$) is the change of the resonance frequency due to a B0 shift induced by the eddy currents inside the imaging acquisition window. The gradient moment ($\Delta M_E$) is measured as a product of an echo center shift caused by the diffusion-weighting gradient pulses and the readout gradient strength used to acquire the projection data. The gradient offset ($\Delta G_E$) is measured as a product of the readout gradient strength and a relative change of the object size induced by the diffusion-weighting gradient pulses. The frequency shift ($\Delta f_E$) is measured as a product of the readout acquisition bandwidth and a relative shift of the object observed in the projection induced by the diffusion-weighting gradient pulses. Further, the adjustment to the DMRI sequence may include introducing a compensation gradient moment of:

$$\Delta M_{comp} = -\Delta M_E + \Delta G_E \cdot T_{peak}$$

where $T_{peak}$ is time from the beginning of the acquisition window to the expected peak position of the imaging echo signal, introducing a gradient offset during the image acquisition window of:

$$\Delta G_{ro} = -\Delta G_E$$

and a frequency offset during the image acquisition window of:

$$\Delta f_{ro} = -\Delta f_E$$

A system has been developed for diffusion magnetic resonance imaging (DMRI) comprising: a main magnet applying a static magnetic field ($B_0$); a plurality of electromagnetic gradient coils for applying orthogonal gradient fields; at least one radio frequency (RF) coil for applying RF pulses and acquiring RF resonance signals from nuclei in an object; at least one pulse sequence controller adapted to apply pulse sequences to the gradient coils and RF coil; a programmable processor for controlling the pulse sequence controller, wherein the processor accesses a memory storing programs for acquiring projection data using a first diffusion weighting sequence including a diffusion weighting segment and a projection acquisition segment, and wherein the processor applies the projection data to determine eddy current parameters that characterize the effects of eddy currents induced by the diffusion-weighting gradient pulses, and wherein the processor applies the eddy current parameters to adjust the first diffusion weighting sequence to produce a second diffusion weighting sequence for imaging.

DETAILED DESCRIPTION OF THE INVENTION

Figure 1:
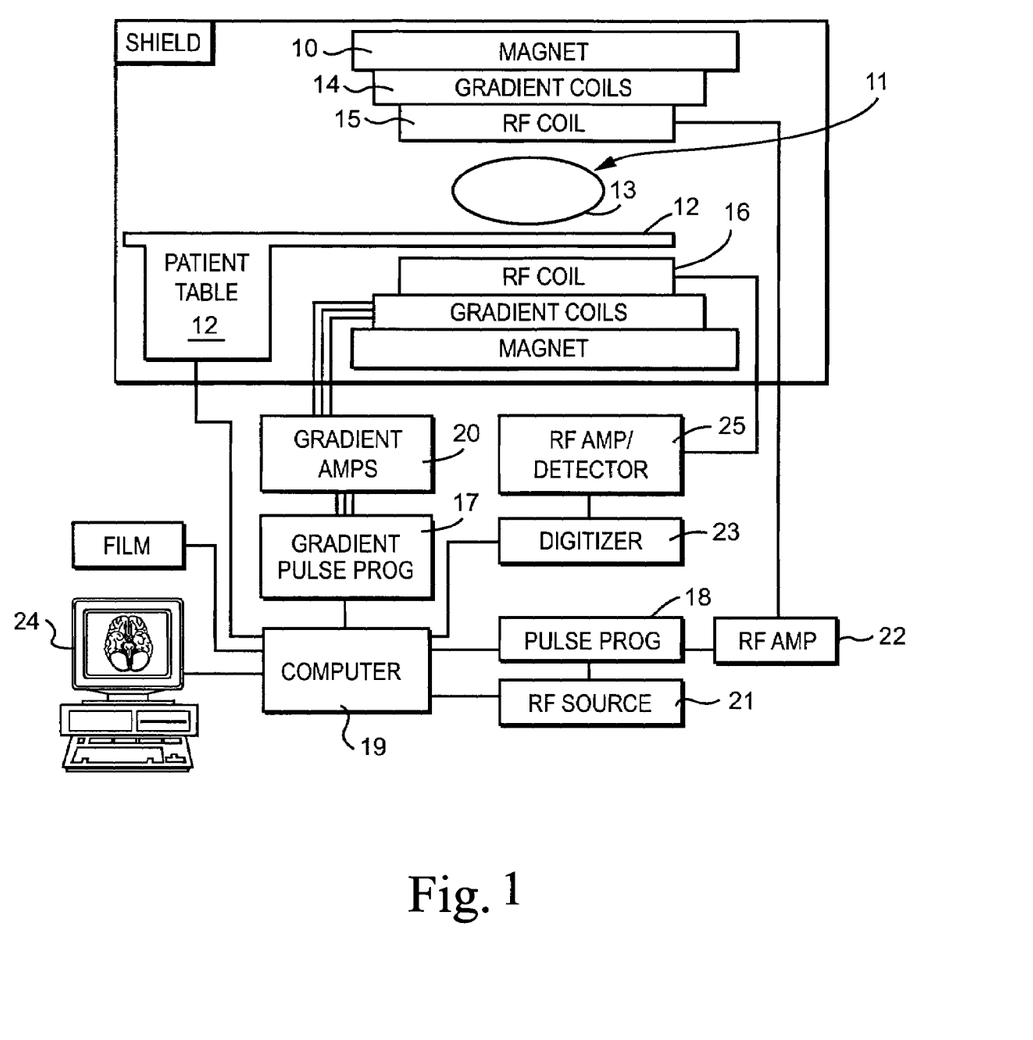
FIG. 1 is a schematic diagram of an MRI system.

As shown in FIG. 1, a magnetic resonance imaging (MRI) system typically includes a large magnet 10 that applies a static magnetic field ($B_0$) to an object 13 being imaged, gradient coils 14 for applying spatially distributed gradient magnetic fields ($G_x$, $G_y$, and $G_z$) to the object along three orthogonal coordinates, and RF coils 15 and 16 to transmit and receive RF signals to and from the selected nuclei of the object. The RF coils 15 and 16 may be part of a single coil, separate coils or may each be RF coil arrays. The object 13 lies on a table 12 such that a portion of the object to be imaged is in an "imaging volume" 11 between the magnet and coils, which defines a field of view (FOV) of the MRI system.

To acquire MRI data, the MRI system generates magnetic gradient fields and RF nutation pulses using MRI pulse sequence controllers 17 and 18 that operate under the control of a programmable processor 19, which may comprise a workstation computer 24. In addition, the processor 19 controls a gradient pulse amplifier 20, RF source and amplifier circuits 21, 22, and an RF receiver amplifier circuit 25. The MR signal circuits (e.g., RF source and receiver amplifiers 22, 25) are suitably interfaced with MR signal RF coils 15, 16 located within the shielded MRI system gantry. The received MR RF echo signal responses are digitized by a digitizer 23 and passed to the processor 19, which may include array processors or the like for image processing and suitable computer program storage media wherein computer programs are stored and selectively utilized to control the acquisition and processing of MR signal data and to produce images on a display terminal of the control workstation computer 24. The MRI system control workstation computer may include a suitable keyboard, touch screen or other input devices for exerting operator control. Images may also be recorded directly on film, stored electronically or printed on a suitable media by a printing device.

Figure 2:
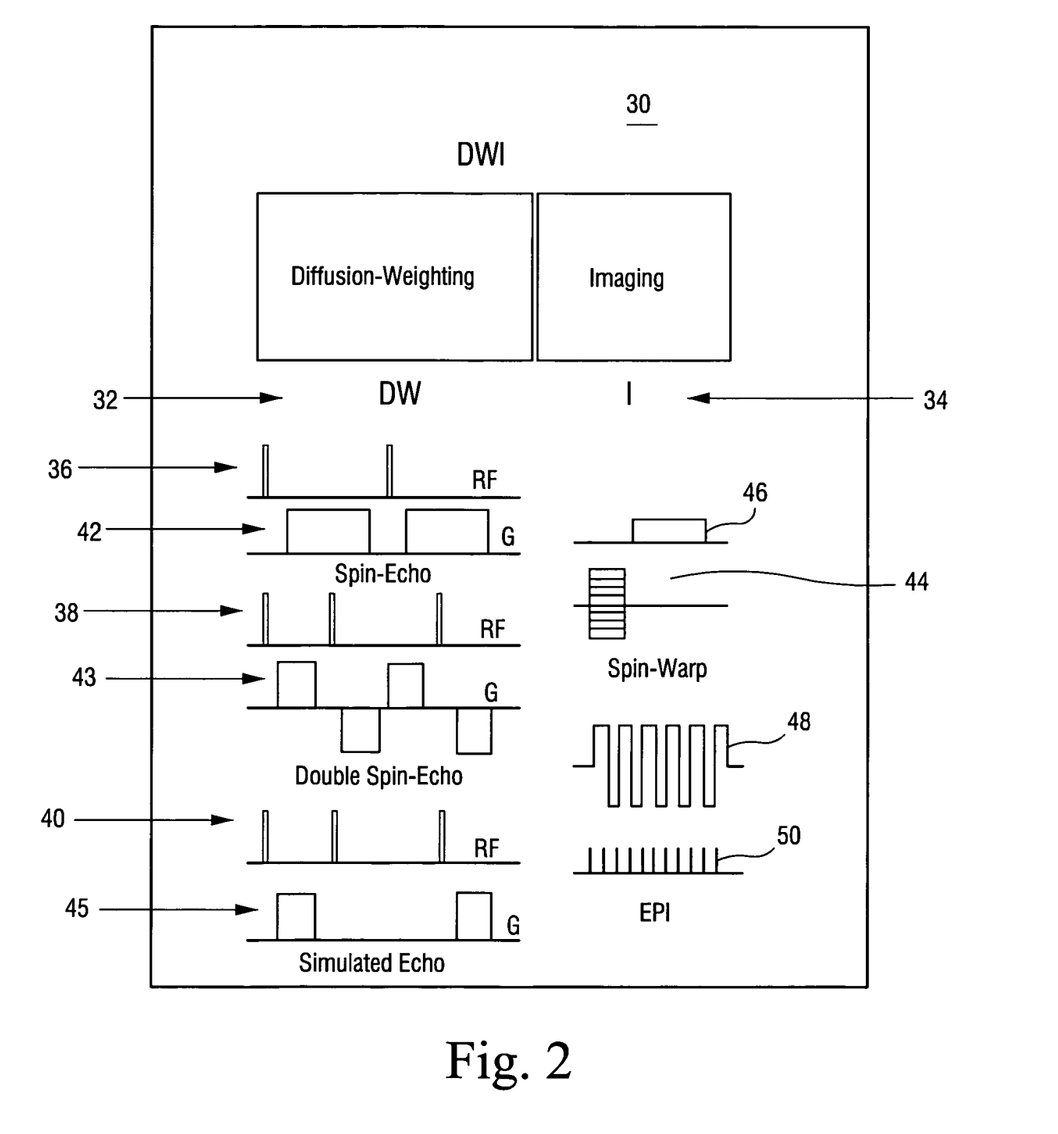
FIG. 2 is a schematic diagram of the diffusion magnetic resonance imaging (DMRI) process divided into diffusion weighting and imaging.

FIG. 2 shows exemplary diffusion magnetic resonance imaging (DMRI) sequences 30, which may be conventional and well-known sequences to those of ordinary skill in the art of MRI sequences. A DMRI sequence 30 can be divided, for purposes of this discussion, into a diffusion-weighting (DW) segment 32 and an imaging (I) segment 34, as indicated by the respective headings shown in FIG. 2. The DW segment 32 may be conventional DW sequences such as a Stejskal-Tanner spin-echo 36, a double-echo spin-echo 38, and a stimulated echo 40, wherein an RF sequence is applied with diffusion-weighting gradient pulses (G) 42, 43 or 45. Conventional DW sequences are disclosed in: Stejskal E O, Tanner J E, "Spin Diffusion Measurements: Spin Echoes in the Presence of a Time-Dependent Field Gradient", *J. CHEM. PHYS,* 42:288–292 (1965); Reese T G, Heid O, Weisskoff R M, Wedeen V J. "Reduction of Eddy-Current-Induced Distortion in Diffusion MRI Using a Twice-Refocused Spin Echo", *MAGNETIC RESONANCE MEDICINE,* 49:177–182, and Tanner T E, "Use of Stimulated Echo in NMR Diffusion Studies", *J. CHEM. PHYS.* 52:2523–2526.

For example, the spin-echo 36 DW portion may include a 90° and a 180° RF pulse, where each RF pulse is followed by a DW gradient pulse (G) 42. The DW segment could have many other shapes and configurations. Some examples are shown in FIG. 2. One example is a double spin echo RF sequence 38 comprising a 90 degree RF pulse and a pair of 180 degree pulses, each of which 180 degree pulse is surrounded by pair of bipolar DW gradient pulses 43. Another well known example is a stimulated echo RF sequence 40 comprising three RF pulses and a pair of DW pulses 45, one after each of the first and third RF pulses. Flow compensated versions of each of these DW gradient pulses 42, 43, and 45 are well known. These examples are only the simplest cases of a large class of published DW sequence segments known to those of ordinary skill in the art of MRI sequences.

The imaging sequence 34 acquires RF signals generated by the DW sequence 32. A standard Fourier method may be used for imaging, such as using a spin-wrap method in which incremented phase-encoding gradients 44 are applied to the object to phase encode and a read-out gradient pulse 46 to frequency encode the signal. Alternatively, a single-shot imaging method, such as the echo-planar (EPI) method in which a series of blipped phase-encoding gradient pulses 50 and alternating readout gradient pulses 48 are applied, can be used to acquire the signal. Other known MR image-signal gathering methods may also be applied including, for example: line-scanning [L E Crooks, J C Hoenninger, III, M Arakawa, "Method and Apparatus for Rapid NMR Imaging of Nuclear Densities within an Object", U.S. Pat. No. 4,318,043 (1982)], radial scanning (a.k.a. back-projection) [P Lauterbur, "Image Formation by Induced Local Interactions: Examples Employing Nuclear Magnetic Resonance", Nature 242:190 (1973)] and hybrids such as propeller scanning [J G Pipe, V G Farthing, K P Forbes, "Multishot Diffusion-Weighted FSE Using PROPELLER MRI", Magn Reson Med 47:42–52 (2002)].

Preferably, the diffusion-weighting gradient pulses should not influence the imaging process that follows, except that they introduce image contrast dependent on molecular diffusion. However, eddy currents arise because the diffusion-weighting segment includes strong magnetic field gradient pulses that change rapidly in direction as well as strength. Due to the eddy currents induced by the DW gradients, the total moments of the gradient fields during the diffusion-weighting segment 32 may not return to zero before the imaging segment 34 begins. Non-zero gradient moments experienced by nuclear spins during the diffusion-weighting period may cause signal dispersion that results in data signal loss if the residual gradient moments are not refocused during the imaging period. Also, any DW-induced gradient field and B0 shift that remain during the data acquisition window of the imaging segment may cause geometric distortion of the acquired images.

Figure 3:
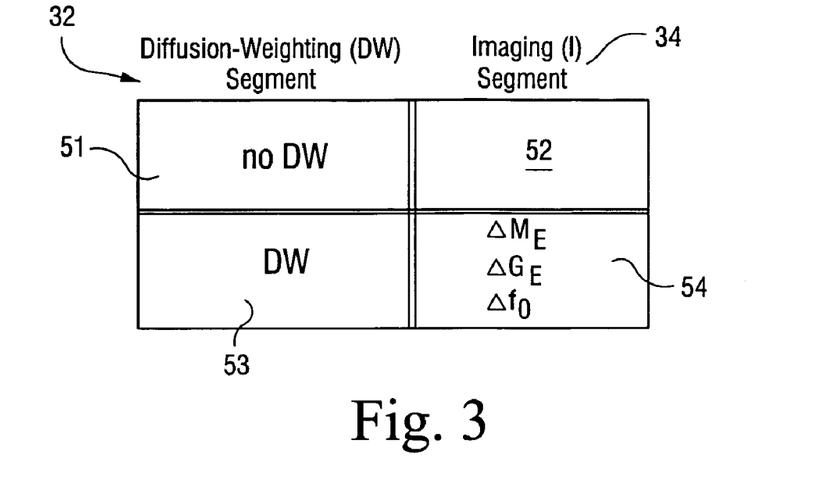
FIG. 3 is a chart characterizing the effects of eddy currents induced by diffusion-weighting gradient pulses on the imaging process.

FIG. 3 schematically depicts the characterization of the eddy current effects due to the diffusion-weighting segment 32. When there is no diffusion weighting 51 (no DW gradients), there are no DW-induced eddy currents to affect the imaging segment 34, as is represented by block 52. A diffusion-weighting (DW) segment 32 causes eddy currents whose effects can be characterized by DW eddy current parameters 54, such as a gradient moment ($\Delta M_E$), a gradient offset ($\Delta G_E$) and a frequency shift ($\Delta f_E$).

A technique is disclosed herein for adjusting the DMRI sequence, 32 and 34, to compensate for the effects of the DW-induced eddy currents. The adjustment of the DMRI sequence is determined based on eddy current parameters that characterize the effects of the eddy currents The DW eddy current parameters 54 are determined using a pre-scan sequence that includes the DW segment 32. The pre-scan sequence is the same as the DMRI sequence 30 that is to be used for imaging, except that the imaging segment 34 is replaced with a simple projection acquisition segment with the projection direction the same as the DW direction. The duration and start time for the projection acquisition and the associated digitizing remains the same as that of the imaging segment 34, so that the timing of the pre-scan sequence is identical to that of the DMRI sequence 30. In addition, projection data without any DW gradients is also measured and used as a reference.

Figure 4:
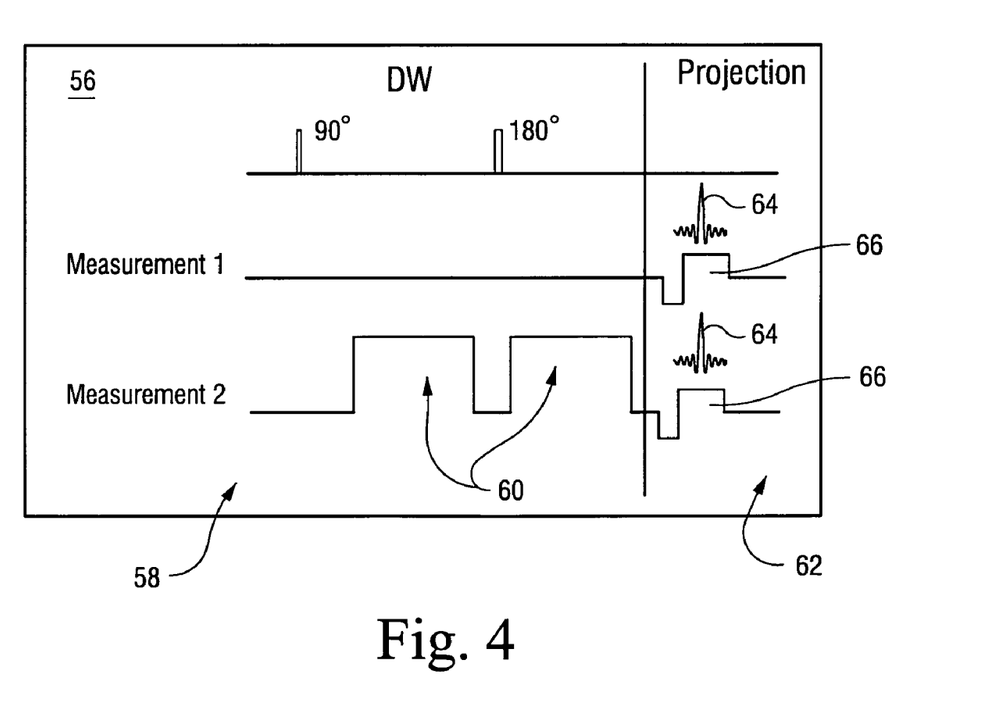
FIG. 4 is a pulse sequence suitable for measurement of the DW eddy parameters and in which after the DW block, a projection of the object is acquired by frequency encoding.

FIG. 4 is a schematic diagram of a pre-scan sequence 56 to be used for measuring eddy current parameters. Though the diffusion-weighting segment 58 shown in FIG. 4 uses a spin-echo as an example, an actual pre-scan sequence uses the exact same DW segment (except for adjustments to compensate for the eddy currents) as that of the DMRI sequence 30 to be used for imaging. Two pre-scan measurements are performed using the pre-scan sequence. A first measurement sequence (Measurement 1) is applied without diffusion-weighting gradients. A second measurement sequence (Measurement 2) is applied with diffusion-weighting gradients 60.

The pre-scan sequence 56 includes a projection segment 62. During the projection segment 62, projection echo signals 64 are acquired with a frequency-encoding gradient 66 along the same direction of the diffusion-weighting gradient 60 in the DW segment 58.

In most cases, the DMRI sequence 30 is used to acquire multiple sets of image data having different diffusion weighting. Acquisitions of data with different diffusion weighting are typically interleaved in one of the three modes, which are represented by A, B and C below:

A. Sequential acquisition: multiple DW data sets are acquired one after another, represented as: $[(DW_1, I_1)_N, (DW_2, I_2)_N, \ldots, (DW_M, I_M)_N]$, where N is the number of repetitions necessary for image encoding and signal averaging, and M is number of DW acquisitions. For example, for acquisition of six (6) DW data sets from ten (10) two-dimensional (2D) slices with 256 phase-encoding steps and 2 signal averages, N=5120 (10 slices×256 phase-encoding steps×2 signal averages) and M=6.

B. Single interleaved acquisition: multiple DW data sets are interleaved into a single large acquisition block, represented as $[\{(DW_1, I_1), (DW_2, I_2), \ldots, (DW_M, I_M)\}N]$, i.e. steps for different DW weighting are completed first.

C. Multiple interleaved acquisition: multiple DW data sets are grouped into several acquisition blocks. Each block may have a single DW data set or a number of interleaved DW sets, e.g. $[\{(DW_1, I_1), (DW_2, I_2), \ldots, (DW_{m1}, I_{m1})\}_N, \{(DW_{m1+1}, I_{m1+1}), (DW_{m1+2}, I_{m1+2}), \ldots, (DW_{m1+m2}, I_{m1+m2})\}_N, \ldots, \{(DW_{M-mL+1}, I_{M-mL+1}), (DW_{M-mL+2}, I_{M-mL+2}), \ldots, (DW_M, I_M)\}N]$, where m1, m2, mL are the number of DW acquisitions in each interleaved blocks, M is the total number of DW acquisitions, and L is the number of interleaving blocks.

Since characteristics of DW-induced eddy currents depend on how acquisitions are interleaved, for each of the above interleaving modes, there is a corresponding pre-scan mode. The three pre-scan modes corresponding to the above three imaging modes are:

A. Sequential projection measurement: for each DW condition ($DW_{(1\ to\ M)}$), steady-state conditions are first established by dummy steps followed by projection scan to collect projection measurements. Dummy scans are performed with the same gradient and RF pulses but without data acquisition. Projection scans may be performed in the manner shown in FIG. 4 and described herein. The full sequence of projection measurements in this mode is as follows:

[(OFF, $P_0$)NP, $(DW_1,W)_{Dum}$,$(DW_1,P_1)_{NP}$,$(DW_2,W)_{Dum}$, $(DW_2,P_2)_{NP}$, . . . , $(DW_M,W)_{Dum}$,$(DW_M,P_M)_{NP}$]

where OFF refers to the first measurement sequence without DW gradients, $P_0$ is the projection segment to acquire reference projection data, W stands for a waiting period in the dummy steps that has the same duration as the projection segment. Dum refers to number of dummy steps necessary to establish steady state conditions, and NP refers to number of repetitions necessary to acquire the projection data. NP may be the same as the number of signal averages.

B. Single interleaved projection measurement: Dummy steps are performed with the DW gradients interleaved to establish steady-state conditions followed by projection measurements. One projection is measured for each DW condition within the interleaved block. An exemplary series of scanning with first no DW, dummy steps for establishing steady-state conditions, and a series of DW projection measurements interleaved into a single acquisition block, is as follows:

[(OFF, $P_0$)$_{NP}$, $(DW_1,W,DW_2,W\ldots DW_M,W)_{Dum}$,$(DW_1, P_1,DW_2,P_2 \ldots DW_M,P_M)_{NP}$]

C. Multiple interleaved projection measurements: for each interleaving block, measurements similar to that performed in projection mode B above is performed. An exemplary series of first scanning with first no DW, a number of interleaving blocks with dummy steps and projection measurements, is as follows:

[(OFF,$P_0$)$_{NP}$,$(DW_1,W,DW_2,W, \ldots ,DW_{m1},W)_{Dum}$,$(DW_1, P_1,DW_2,P_2, \ldots ,DW_{m1},P_{m1})_{NP}, \ldots ,(DW_{m1+1},W, DW_{m1+2},W, \ldots ,DW_{m1+m2},W)_{Dum}, (DW_{m1+1},P_{m1+1}, DW_{m1+2},P_{m1+2}, \ldots ,DW_{m1+m2},P_{m1+m2})_{NP}, \ldots , (DW_{MmL+1},W,D\ W_{MmL+2},W, \ldots ,DW_M,W)_{Dum}, (DW_{M-mL+1},P_{M-mL+1},DW_{M-mL+2},P_{M-mL+2}, \ldots , DW_M, P_M)_{NP}$]

On conclusion of the above projection pre-scan measurements, each DW eddy condition relevant to imaging acquisition is associated with its corresponding projection data ($P_i$) and a common reference projection data ($P_0$). The projection data are processed, such as is described below, to obtain the DW eddy parameters that are in turn used to adjust the DMRI sequence.

To quantify the DW eddy parameters for each DMRI sequence, the following analysis of the projection data may be performed. Using the projection and reference data ($P_1$, $P_0$) corresponding to each DMRI condition, the DW eddy parameters may be determined according to the following steps:

A. A shift, $\Delta t$, of the echo center in the projection signal relative to that of the reference projection signal is determined, such as in milliseconds.

B. The projection data and reference data are transformed, e.g., using one-dimensional (1D) Fourier transform, to obtain a projection profile and a reference profile.

C. A relative shift, $\Delta x$, of the object in the projection profile with respect to the reference profile is determined such as in units of data points.

D. A zoom factor, $\lambda$, of the object size measured in the projection profile relative to the reference profile is determined as the ratio of the object size measured in the projection profile to that measured in the reference profile.

To determine the echo center shift ($\Delta t$), the peak position of each projection echo signal is first determined by finding the maximum of the echo signal. A fractional center shift from the peak position may be determined according to a Linear Ramp Method or a Three-Point Quadratic Function Fitting Method.

Linear Ramp Method: The echo signal is shifted according to the peak position as previously identified and then 1D Fourier transformed to frequency domain. The phase of the Fourier transformed data is fit to a linear ramp with a slope of $\alpha$. The echo center is determined from the peak position and the slope from the fit according to:

$$C_i = J_{peak} + \frac{\alpha \cdot N}{2\pi}$$

where $J_{peak}$ is the peak position from amplitude search, $\alpha$ is the slope from the linear fit to the phase in radian/point, N is number of points acquired in the projection data, and $C_i$ is the echo center of projection signal i.

Three-Point Quadratic Function Fitting Method: The peak position from the amplitude search, together with its left neighbor and right neighbor, is fit to a three-point quadratic function:

$$S = S_{max} - \alpha(\delta - \delta_{max})^2$$

where S is the signal amplitude, a is a constant, $\delta$ is distance from the peak position identified by the amplitude search, and $\delta_{max}$ is the fractional center shift according to the quadratic fit. The echo center is determined according to:

$$C_i = J_{peak} + \delta_{max}$$

The echo center shift for each projection data is determined from the difference between its echo center position and that of the reference data:

$$\Delta t_i = C_i - C_{ref}$$

Where $C_{ref}$ is the echo center of the reference projection data.

A determination is made of the projection shift ($\Delta x$) and Zoom ($\lambda$). The projection shift ($\Delta x$) and zoom ($\lambda$) are determined by maximizing the mutual information between the projection profile and the reference profile such as is described in Pluim J P W, Maintz J B A, Viergever M A, "Mutual-Information-Based Registration of Medical Images: A Survey", *IEEE TRANSACTIONS ON MEDICAL IMAGING* 22:986–1004.

The projection shift and zoom may be determined as follows:

Mutual information between a projection P and its reference R is calculated according to:

$$I(P, R) = \sum_{p,r} q(p, r) \log \frac{q(p, r)}{q(p)q(r)}$$

where I(P,R) is the mutual information between projection P and reference R; q(p) and q(r) are normalized histograms of projection P and reference R, respectively, and q(p, r) is a joint histogram between projection R and reference P.

A range of shift and zoom are applied to the projection and the corresponding mutual information between the shifted/zoomed projection and its reference is calculated. The actual values of shift and zoom are obtained from the P, R pair that yields the maximum mutual information I(P,R).

A determination is made of DW eddy parameters from $\Delta t$, $\Delta x$ and $\lambda$.

$$\Delta M_E = \Delta t \cdot G_{ro}$$

$$\Delta G_E = G_{ro}(\lambda - 1)$$

$$\Delta f_E = SW \frac{\Delta x}{N}$$

where $G_{ro}$ and SW are the readout gradient strength and bandwidth used in projection acquisition, respectively, and N is the total number of points in the projection profile.

The DMRI sequence is modified to compensate for the effects of DW-induced eddy currents. The adjustments to the DMRI sequence are determined based on the DW eddy parameters, such as by using the following method:

A. Introducing into the DMRI sequence a compensation gradient moment of:

$$\Delta M_{comp} = -\Delta M_E + \Delta G_E \cdot T_{peak}$$

where $T_{peak}$ is time from the beginning of the acquisition window to the expected peak position of the echo signal. It is within the ability of a person with ordinary skill of the art in MRI to implement the compensation gradient moment. One such implementation is to introduce gradient pulses or alter the existing gradient pulses before the acquisition window to yield $\Delta M_{comp}$.

B. Introducing into the DMRI sequence a gradient offset having the orientation and size of $-\Delta G_E$ during the readout window.

C. Offsetting the RF carrier frequency during the readout window of the DMRI sequence by an amount of $-\Delta f_E$.

The modified DMRI sequence acquires imaging data of the same examination object that should be substantially free of the effects of eddy currents.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for diffusion magnetic resonance imaging (DMRI) comprising:
   acquiring diffusion weighting (DW) prescan projection data of an examination object using a first sequence, said first sequence including a plurality of interleaved DW segments and a projection acquisition segment wherein the DW segments further includes DW gradient pulses having at least one of a plurality of directions and a plurality of magnitudes;
   acquiring reference prescan projection data using the first sequence with the DW gradient pulses turned off;
   comparing the DW prescan projection data and the reference prescan projection data to determine eddy current parameters that characterize the effects of the eddy currents induced by the DW gradient pulses;
   forming a second sequence by adjusting the first sequence based on the eddy current parameters and including an image acquisition segment in the second sequence, wherein the second sequence includes the plurality of interleaved DW segments having the at least one of a plurality of directions and a plurality of magnitudes and in the same order as the DW segments in the first sequence;
   acquiring image data of the examination object using the second sequence, and
   generating an image of the examination object using the acquired image data.

2. A method for diffusion magnetic resonance imaging (DMRI) comprising:
   acquiring diffusion weighting (DW) prescan projection data of an examination object using a first sequence said first sequence including a DW segment and a projection acquisition segment wherein the DW segment further includes DW gradient pulses;
   acquiring reference prescan projection data using the first sequence with the DW gradient pulses turned off;
   comparing the DW prescan projection data and the reference prescan projection data to determine eddy current parameters that characterize the effects of the eddy currents induced by the DW gradient pulses;
   forming a second sequence by adjusting the first sequence based on the eddy current parameters and including an image acquisition segment in the second sequence;
   substituting the image acquisition segment in the second sequence for the projection acquisition segment in the first sequence;
   eliminating at least one dummy step in the first sequence used for establishing steady-state conditions;
   acquiring image data of the examination object using the second sequence; and
   generating an image of the examination object using the acquired image data.

3. The method of claim 2 further comprising performing multiple DW measurements interleaved in the first sequence and in the second sequence.

4. The method of claim 3 wherein the multiple DW measurements include a step selected from a group of steps comprising:
   multiple DW measurements sequentially acquired;
   multiple DW measurements singly interleaved in one block, and
   multiple DW measurements interleaved in a plurality of interleaving blocks.

5. The method of claim 2 wherein a projection direction of the pre-scan sequence and a direction of the DW segment are the same.

6. The method of claim 2 wherein the projection acquisition segment lacks a phase-encoding gradient pulse.

7. The method of claim 2 wherein the projection acquisition segment lacks a slice-encoding gradient pulse.

8. A method for diffusion magnetic resonance imagine (DMRI) comprising:
   acquiring diffusion weighting (DW) prescan projection data of an examination object using a first sequence said first sequence including a DW segment and a projection acquisition segment wherein the DW segment further includes DW gradient pulses;
   acquiring reference prescan projection data using the first sequence with the DW gradient pulses turned off;

comparing the DW prescan projection data and the reference prescan projection data to determine eddy current parameters that characterize the effects of the eddy currents induced by the DW gradient pulses, wherein the eddy current parameters include a gradient moment ($\Delta M_E$), a gradient offset ($\Delta G_E$) and a frequency shift ($\Delta f_0$);

forming a second sequence by adjusting the first sequence based on the eddy current parameters and including an image acquisition segment in the second sequence;

acquiring image data of the examination object using the second sequence, and generating an image of the examination object using the acquired image data.

9. The method of claim 8 wherein the gradient moment ($\Delta M_E$) is determined from a product of an echo center shift of the DW prescan projection data with respect to the reference prescan projection data and a readout gradient strength.

10. The method of claim 8 wherein the gradient offset ($\Delta G_E$) is determined from a product of a readout gradient strength and a zoom factor minus one.

11. The method of claim 8 wherein the frequency shift ($\Delta f_E$) is determined from a product of a readout sampling bandwidth and a ratio of a projection shift to the length of the projection profile.

12. A method for diffusion magnetic resonance imaging (DMRI) comprising:

acquiring diffusion weighting (DW) prescan projection data of an examination object using a first sequence, said first sequence including a DW segment and a projection acquisition segment wherein the DW segment further includes DW gradient pulses;

acquiring reference prescan projection data using the first sequence with the DW gradient pulses turned off;

comparing the DW prescan projection data and the reference prescan projection data to determine eddy current parameters that characterize the effects of the eddy currents induced by the DW gradient pulses;

forming a second sequence by adjusting the first sequence based on the eddy current parameters and including an image acquisition segment in the second sequence;

wherein the adjustment to the first sequence includes introducing a compensation gradient-tuning moment ($\Delta M_{comp}$) where:

$$\Delta M_{comp} = \Delta M_E + \Delta G_E \cdot T_{peak}$$

wherein $T_{peak}$ is a time period from a beginning of an acquisition window to an expected peak position of an echo signal;

introducing a compensation gradient offset ($\Delta G_{ro}$) during a readout of the image data, wherein $$\Delta G_{ro} = -\Delta G_E,$$

introducing a receiver frequency offset ($\Delta f_{ro}$) during the readout of the image data, wherein $$\Delta f_{ro} = -\Delta f_E$$

acquiring image data of the examination object using the second sequence;

and, generating an image of the examination object using the acquired image data.

13. A method for compensating for eddy currents induced by a diffusion weighting sequence during diffusion magnetic resonance imaging, said method comprising:

acquiring diffusion weighting (DW) prescan projection data of an examination object using a first sequence including a plurality of interleaved DW segments and a projection acquisition segment, wherein the DW segments includes diffusion weighting gradient pulses having at least one of different directions and different magnitudes;

acquiring a reference prescan projection data using the first sequence with the diffusion weighting gradient pulses turned off;

comparing the DW prescan projection data and the reference prescan projection data to determine eddy current parameters that characterize the effects of the eddy currents induced by the DW gradient pulses;

forming a second sequence based on the first sequence adjusted to account for the eddy current parameters and having an image acquisition segment, wherein the second sequence includes the plurality of interleaved DW segments having the at least one of a plurality of directions and a plurality of magnitudes and in the same order as the DW segments in the first sequence;

acquiring image data of the said examination object using the second imaging sequence, and generating an image of the examination object using the acquired image data.

14. A method for compensating for eddy currents induced by a diffusion weighting sequence during diffusion magnetic resonance imaging, said method comprising:

acquiring diffusion weighting (DW) prescan projection data of an examination object using a first sequence including a DW segment and a projection acquisition segment, wherein the DW segment includes diffusion weighting gradient pulses;

acquiring a reference prescan projection data using the first sequence with the diffusion weighting gradient pulses turned off;

comparing the DW prescan projection data and the reference prescan projection data to determine eddy current parameters that characterize the effects of the eddy currents induced by the DW gradient pulses;

forming a second sequence based on the first sequence adjusted to account for the eddy current parameters and having an image acquisition segment, wherein the second sequence differs from the first sequence in that the image acquisition segment of the second sequence replaces the projection acquisition segment of the first sequence, and at least one dummy step in the first sequence for establishing steady-state conditions is eliminated in the second sequence;

acquiring image data of the said examination object using the second imaging sequence, and generating an image of the examination object using the acquired image data.

15. The method of claim 14 further comprising performing multiple DW measurements interleaved in the first sequence and in the second sequence.

16. The method of claim 15 wherein the multiple DW measurements include a step selected from a group of steps comprising:

multiple DW measurements sequentially acquired;

multiple DW measurements singly interleaved in one block; and multiple DW measurements interleaved in a plurality of interleaving blocks.

17. The method of claim 14 wherein a projection direction of the pre-scan sequence and a direction of the DW are the same.

18. The method of claim 14 wherein the projection acquisition segment has no phase-encoding gradient pulse.

19. The method of claim 14 wherein the projection acquisition segment has no slice-encoding gradient pulse.

20. A method for compensating for eddy currents induced by a diffusion weighting sequence during diffusion magnetic resonance imaging, said method comprising:
acquiring diffusion weighting (DW) prescan projection data of an examination object using a first sequence including a DW segment and a projection acquisition segment, wherein the DW segment includes diffusion weighting gradient pulses;
acquiring a reference prescan projection data using the first sequence with the diffusion weighting gradient pulses turned off;
comparing the DW prescan projection data and the reference prescan projection data to determine eddy current parameters that characterize the effects of the eddy currents induced by the DW gradient pulses, wherein the eddy current parameters comprise a gradient moment ($\Delta M_E$), a gradient offset ($\Delta G_E$) and a frequency shift ($\Delta f_0$);
forming a second sequence based on the first sequence adjusted to account for the eddy current parameters and having an image acquisition segment;
acquiring image data of the said examination object using the second imaging sequence, and
generating an image of the examination object using the acquired image data.

21. The method of claim 20 wherein the gradient moment ($\Delta M_E$) is determined from a product of an echo center shift of the DW projection data with respect to a reference projection data and a readout gradient strength.

22. The method of claim 20 wherein the gradient offset ($\Delta G_E$) is determined from a product of a readout gradient strength and a zoom factor minus one.

23. The method of claim 20 wherein the frequency shift ($\Delta f_E$) is determined from a product of a readout sampling bandwidth and a ratio of a projection shift to the length of the projection profile.

24. A method for compensating for eddy currents induced by a diffusion weighting sequence during diffusion magnetic resonance imaging, said method comprising:
acquiring diffusion weighting (DW) prescan projection data of an examination object using a first sequence including a DW segment and a projection acquisition segment, wherein the DW segment includes diffusion weighting gradient pulses;
acquiring a reference prescan projection data using the first sequence with the diffusion weighting gradient pulses turned off;
comparing the DW prescan projection data and the reference prescan projection data to determine eddy current parameters that characterize the effects of the eddy currents induced by the DW gradient pulses;
forming a second sequence based on the first sequence adjusted to account for the eddy current parameters and having an image acquisition segment, wherein adjusting the first sequence includes:
introducing a compensation gradient-tuning moment ($\Delta M_{comp}$) where:

$$\Delta M_{comp} = -\Delta M_E + \Delta G_E \cdot T_{peak}$$

wherein $T_{peak}$ is a time period from a beginning of an acquisition window to an expected peak position of an echo signal;
introducing a compensation gradient offset ($\Delta G_{ro}$) during a readout of the image data; where $$\Delta G_{ro} = -\Delta G_E,$$

and introducing a receiver frequency offset ($\Delta f_{ro}$) during the readout of the image data, where $$\Delta f_{ro} = -\Delta f_E$$

acquiring image data of the said examination object using the second imaging sequence, and
generating an image of the examination object using the acquired image data.

25. A system for diffusion magnetic resonance imaging (DMRI) comprising:
a main magnet applying a static magnetic field (B0);
a plurality of electromagnetic gradient coils for applying orthogonal gradient fields;
at least one radio frequency (RF) coil for applying RF pulses and acquiring RF resonance signals from nuclei in an examination object within the main magnet, gradient coils and RF coil;
at least one pulse sequence controller adapted to apply pulse sequences to the gradient coils and RF coil;
a programmable processor for controlling the pulse sequence controller, wherein the processor accesses a memory storing at least one program for acquiring projection data using a prescan sequence comprising a plurality of interleaved diffusion weighting segments and a projection acquisition segment, wherein the diffusion weighting segments includes diffusion weighting gradient pulses having at least one of a plurality of directions and a plurality of magnitudes, and
wherein the processor compares presence projection data to determine eddy current parameters that characterize the effects of eddy currents induced by the DW gradient pulses,
wherein the processor adjusts a second sequence comprising of the interleaved diffusion weighting segments and an image acquisition segment, wherein the interleaved diffusion weighting segments have the at least one of a plurality of directions and a plurality of amplitudes and are in the same order as in the diffusion weighting segments in the prescan sequence.

* * * * *